United States Patent [19]
Martin et al.

[11] Patent Number: 5,363,045
[45] Date of Patent: Nov. 8, 1994

[54] HAND-HELD NON-CONTACTING ELECTRIC FIELD DETECTION TOOL

[76] Inventors: George G. Martin, 1743 Walnut Rd., Kent, Ohio 44240; Thomas J. Martin, 1984 Park Forest Ave., State College, Pa. 16803

[21] Appl. No.: 935,930

[22] Filed: Aug. 27, 1992

[51] Int. Cl.$^5$ .................... F23Q 23/10; G01M 15/00; F02P 17/00; G01R 19/14
[52] U.S. Cl. .................................. 324/395; 324/133; 324/72.5
[58] Field of Search ............. 324/393, 395, 133, 72.5, 324/72, 158 P, 149, 501, 528, 519, 530, 527, 555, 556

[56] References Cited

U.S. PATENT DOCUMENTS

| | | | |
|---|---|---|---|
| 3,369,175 | 2/1968 | Morris | 324/395 |
| 4,006,409 | 2/1977 | Adams | 324/133 X |
| 4,296,376 | 10/1981 | Bartol, Jr. | 324/133 X |
| 5,103,165 | 4/1992 | Sirattz | 324/133 |

OTHER PUBLICATIONS

Product Bulletin Firing Indicators–Spark Plug Service Tools–Hand Tool Industries, Inc., Kent, Ohio, Jun. 1985.

*Primary Examiner*—Gerard R. Strecker
*Assistant Examiner*—Warren S. Edmonds
*Attorney, Agent, or Firm*—Michael Sand Co.

[57] ABSTRACT

A portable hand held diagnostic tool which non-invasively detects an electric field when placed adjacent a component of a spark plug firing portion of an ignition system and provides a positive indication of the detected electric field. A printed circuit board containing a control circuit, a replaceable battery supply, an ON-/OFF switch, an indicator such as an LED, and a pickup antenna, is slidably mounted within the hollow interior of a dielectric tubular case. The antenna is located adjacent a pickup end of the case and detects the electric field generated by an ignition system during firing of a spark plug which actuates the LED in response to the detected firing. The dielectric case is free of external metal parts adjacent the pickup end to help minimize arcing. A battery test circuit may be incorporated into the control circuitry to ensure an adequate power supply for operation of the control circuitry. A fixed or variable resistor enables the sensitivity of the firing pickup to be selected.

21 Claims, 4 Drawing Sheets

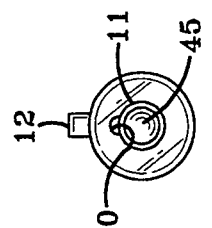
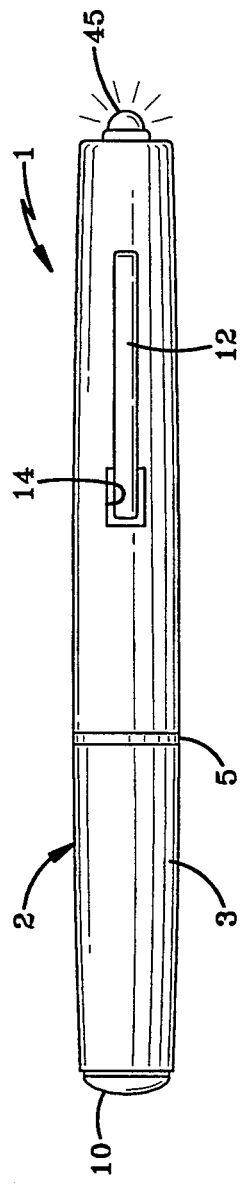
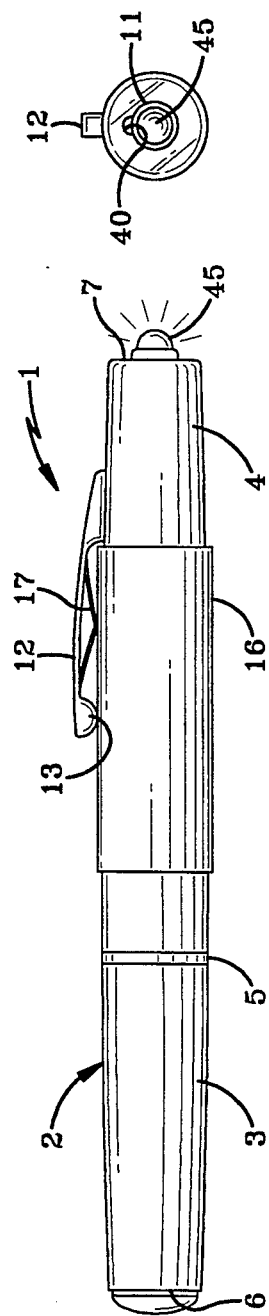
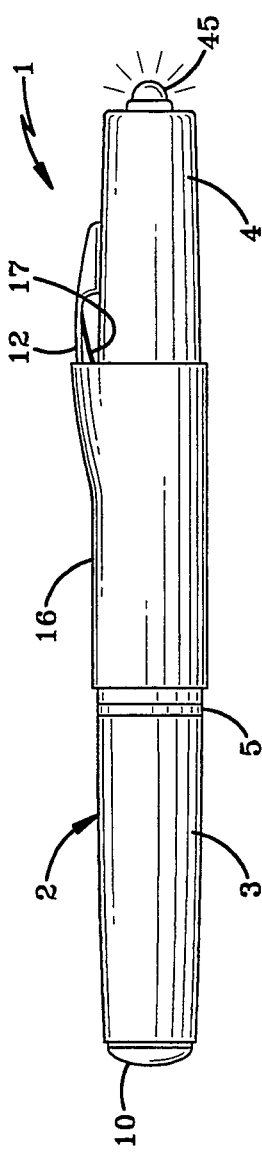
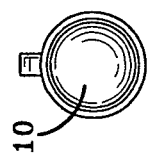

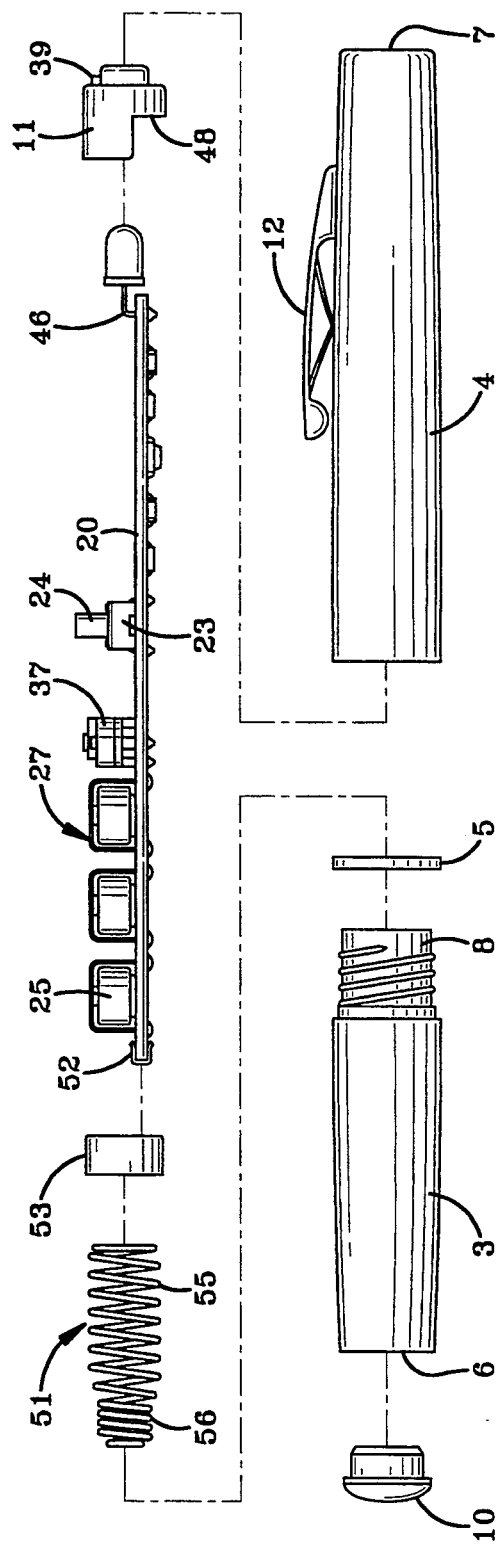

HAND-HELD NON-CONTACTING ELECTRIC FIELD DETECTION TOOL

BACKGROUND OF THE INVENTION

1. Technical Field

The invention relates to a diagnostic tool for non-invasively detecting when a spark plug ignition system fires and to provide a visual or audio indication of such firing. More particularly, the invention relates to such a diagnostic tool which uses an antenna to pickup or detect the electric field generated by a component of an ignition system during firing to provide a visual or audio firing indication eliminating the heretofore spark plug firing indicator using a metallic contact and a neon indicating tube or lamp.

2. Background Information

The prior art of spark plug firing indicators and ignition system testers is comprised of devices which use neon lamps or neon tubes that act as both firing detectors and firing indicators using a single lamp or tube.

When a firing voltage is generated by an ignition system, an electric field develops around the spark plugs, spark plug wires, and the secondary of the ignition coil. The electric field can directly ionize inert gas contained in a neon tube if the tube is placed directly in the field. Such is the principle of operation of neon-type spark plug and ignition system diagnostic tools which have worked very well in the past.

One disadvantage of the neon-type tools is that the duration, and ultimately the brightness, of the flash or glow of the neon gas, is directly related to the duration of the electric field surrounding the device. Short duration firing sequences cause short duration flashes which are difficult to see. Furthermore, because the flashing and pickup characteristics of the neon tube are based on the physical properties of the gas in the enclosed tube, there is no mechanism for any kind of user sensitivity adjustment. This can be a disadvantage when trying to diagnose problems with the many different ignition systems made by different manufacturers.

Modern engines and ignition system components have changed from past models to such a degree that the neon-type tools now produce a flash that's very difficult to see. This makes the tools almost useless for today's diagnostic technician. Changes in high-energy ignitions, higher dielectric strength spark plug wires, shorter duration firing voltages, and solid-state distributors are all contributing to help make the neon-type tools obsolete.

The present invention provides two primary functional advantages over neon-type and similar ignition system diagnostic tools.

The first advantage involves the detection of the electric field generated by the firing voltage of an ignition system. The present invention uses an antenna to non-invasively pick up the electric field and uses solid-state circuitry to compare its strength with a variable sensitivity threshold. Once the threshold is reached or exceeded, part of the circuit generates an indication to the user. The variable sensitivity and solid-state nature of the tool, compared to the fixed and often erratic sensitivity of a neon-type tool, provide more accurate and repeatable readings.

The second advantage involves the use of electronic circuitry to generate a firing indication that is independent of the duration of the firing voltage. During the firing of a spark plug, for example, if the firing voltage is only present for tens of microseconds, an indication signal will still be present for many thousands of microseconds. The circuit generated extended time period of the indication signal allows a user to detect short duration firings for accurate diagnostic troubleshooting.

SUMMARY OF THE INVENTION

Objectives of the invention include providing a diagnostic tool which is formed inexpensively of a molded dielectric plastic material, which is compact and light in weight, easily carried in the shirt pocket of the user, and which has no external to internal conductive metallic pickup parts which would possibly cause arcing and shock the user thereof.

A further objective is to provide such a diagnostic tool which uses a pickup antenna housed within the end of a dielectric case or housing, which detects the electric field generated by the ignition system during firing of a spark plug, eliminating the heretofore used neon tube or lamp to pickup the field.

A further objective of the invention is to provide such a diagnostic tool which uses an LED as the visual firing indicator, which permits use in bright ambient light or direct sunlight since it has higher intensity than that produced by neon firing indicators; or which uses an audio signal as another type of firing indicator.

Still another objective of the invention is to provide such a diagnostic tool which uses a rugged printed circuit board mounted within the dielectric outer housing or case, having a replaceable power supply formed of a plurality of miniature batteries, and which has a battery test circuit which indicates to the user when the batteries are dead, installed incorrectly or when the LED or integrated circuit is faulty.

Another objective of the invention is to provide such a diagnostic tool which uses an integral reverse-battery voltage protection device to prevent the electronics of the control circuit from being destroyed if a user installs the batteries incorrectly such as backwards, and in which the battery protection feature will not drain the batteries if they are installed backwards.

A further objective of the invention is to provide such a diagnostic tool having no exposed metal on the pickup end of the tool which could cause a spark to arc across from an exposed spark plug wire to the metal on the tool possibly shocking the user, and which uses solid state electronic circuitry protected within the housing to indicate the sparking action of the plug, replacing the heretofore fragile and leakage prone neon type indicating devices.

A still further objective of the invention is to provide such a diagnostic tool in which the LED is illuminated for a sufficient period of time to allow the user to notice that a spark actually had occurred, and which has a user adjustable sensitivity selector to vary the sensitivity of the pickup based on the type of ignition system and spark plugs being tested.

Another objective of the invention is to provide such a diagnostic tool having a shock absorbing spring mount within the outer housing or case to reduce breakage of the internally mounted printed circuit board if the tool is dropped and mishandled, which uses readily available batteries making the tool reusable instead of a throw-away, which uses a momentary ON/OFF power switch which prevents the tool from being left on for long periods of time and unnecessarily draining the batteries, and in which the ON/OFF switch doubles as a pocket clip to further prevent leaving the tool in an ON position.

A still further objective of the invention is to provide such a diagnostic tool which can be used one handed like the prior art neon type indicators, which is easily and readily usable by the professional mechanic and by the home mechanic, which is extremely lightweight and formed of a high-impact resistant plastic in a variety of colors, and which can be readily disassembled for repair and/or replacement of the power supply batteries.

These objectives and advantages are obtained by the ignition system diagnostic tool of the invention, the general nature of which may be stated as including a portable hand held case having a pickup end adapted to be placed adjacent a component of a spark plug firing portion of an ignition system to be tested; antenna means mounted in the case adjacent the pickup end for receiving an electric field generated by an ignition system; circuit means located within the case electrically operatively connected to the antenna means for detection of the received electric field and for generation of a detected electric field signal; and indicator means operatively connected to the circuit means for providing a positive indication of the detected electric field.

BRIEF DESCRIPTION OF THE DRAWINGS

Preferred embodiments of the invention, illustrative of the best modes in which applicants have contemplated applying the principles, are set forth in the following description and are shown in the drawings and are particularly and distinctly pointed out and set forth in the appended claims.

FIG. 1 is a side elevational view of the diagnostic tool of the present invention with a dielectric safety sleeve beneath the pocket clip to maintain the tool in an OFF position;

FIG. 1A is a side elevational view similar to FIG. 1 with the safety sleeve extending over the pocket clip to maintain the tool in an ON position;

FIG. 2 is a left hand end elevational view of FIG. 1;

FIG. 3 is a right hand end elevational view of FIG. 1;

FIG. 4 is a top plan view of FIG. 1 with the safety sleeve removed;

FIG. 5 is an exploded side elevational view of the diagnostic tool of FIGS. 1–4;

FIG. 6 is a longitudinal sectional view of the diagnostic tool in assembled condition;

Similar numerals refer to similar parts throughout the drawings.

DESCRIPTION OF THE PREFERRED EMBODIMENTS

Figure 7:
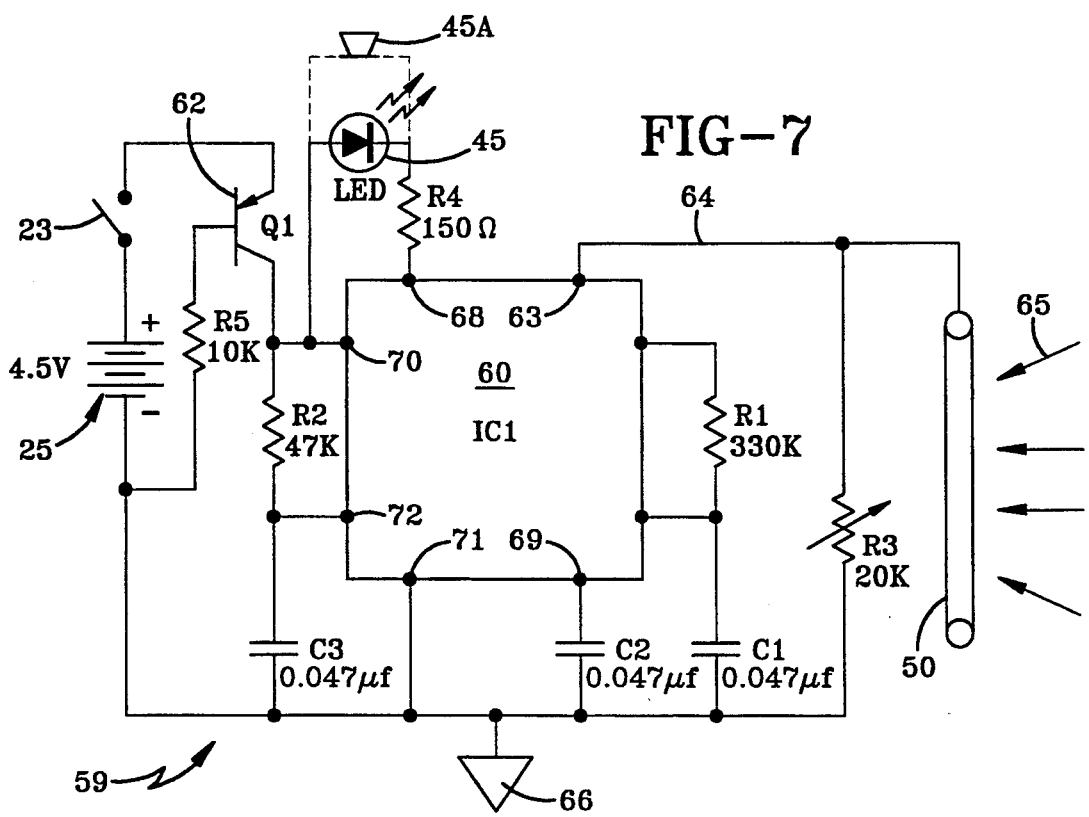
FIG. 7 is a schematic wiring diagram of the electrical control circuitry of the diagnostic tool.

The diagnostic tool of the present invention is indicated generally at 1, and is shown particularly in FIGS. 1–4. Tool 1 includes a hollow tubular shaped outer housing or case indicated generally at 2, formed of a high-impact resistant dielectric plastic material. Case 2 has a pickup end section 3 and a firing end section 4, readily connected together as shown in FIGS. 5 and 6, by a threaded section 8 with a trim ring 5 being located therebetween. Case 2 is formed with open ends 6 and 7. Open end 6 is closed by a dome-shaped end cap 10 formed of a plastic material, and an LED mounting bushing 11 is mounted in the open end 7 of firing indicating section 4.

A usual spring biased pocket clip 12 is mounted at one end on indicating section 4 of case 2, and has an end knob 13 which is aligned with an opening 14 formed in case section 4. A sleeve 16 formed of a dielectric plastic material, is slidably mounted on indicating section 4 of case 2 and is held in position by a leaf spring 17 or knob 13 of pickup clip 12, to prevent knob 13 from entering opening 14 and actuating tool 1, as discussed more fully below. Sleeve 16 also can be slid over clip 12 to maintain tool 1 in an ON position as shown in FIG. 1A.

Referring particularly to FIGS. 5 and 6, an elongated printed circuit board 20 is slidably mounted within hollow interior 21 of case section 4, and has various resistors and capacitors and other electronic control circuitry components mounted thereon in order to form the control circuit which is shown schematically in FIG. 7. An ON/OFF switch 23 is mounted on circuit board 20 and has a spring biased plunger 24 which aligns with and extends into opening 14 of case 2 beneath knob end 13 of pocket clip 12. It is easily seen in FIG. 6 that after removal of safety sleeve 16 as shown in FIG. 1, from beneath knob 13, that clip 12 can be depressed easily by the user in the direction of Arrow A, whereby knob 13 depresses plunger 24 to actuate switch 23. Switch 23 is biased to the OFF position. It is easily seen that use of sleeve 16 as shown in FIG. 1A will maintain switch 23 in the ON position.

Figure 10:
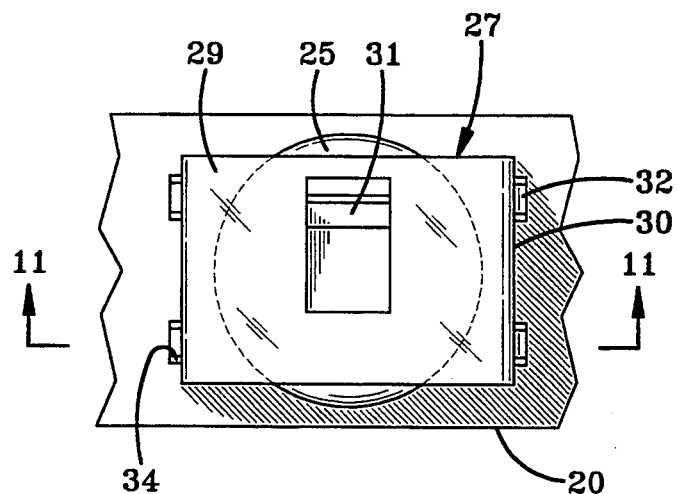
FIG. 10 is a fragmentary top plan view of one of the battery retaining clips of the printed circuit board shown in FIGS. 5 and 6.
Figure 11:
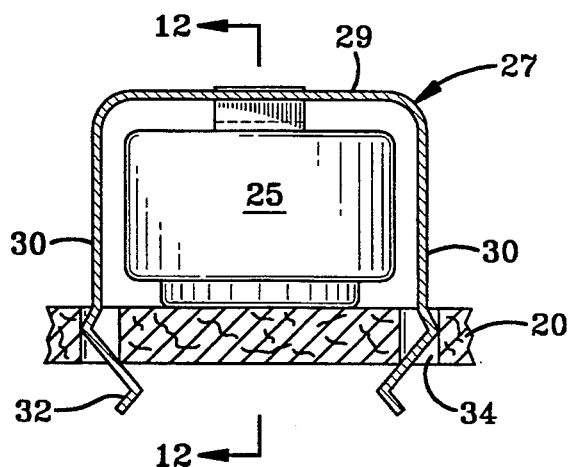
FIG. 11 is a fragmentary sectional view taken on line 11—11, FIG. 10.
Figure 12:
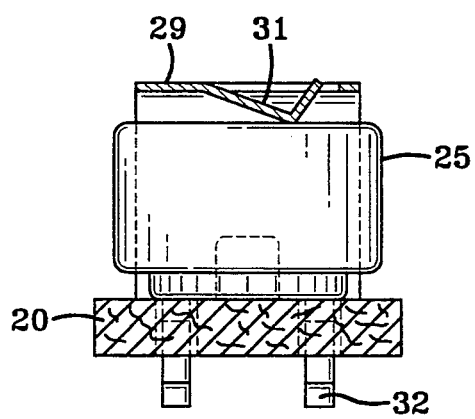
FIG. 12 is a fragmentary sectional view taken on line 12—12, FIG. 11.

The control circuitry of the printed circuit board 20 further includes a replaceable power supply formed by three batteries 25 which are retained on circuit board 20 and in electrical contact with the electronic components thereof, by retaining clips 27. Batteries 25 are usual 1.5 volt D.C. batteries of the type normally used for hearing aids or other small electronic devices, electric watches, etc. Battery retaining clips 27 are shown particularly in FIGS. 10–12. Each clip has a generally U-shaped cross-sectional configuration with a top wall 29 and a pair of sidewalls 30. Battery 25 is located between legs 30 and is securely clamped in position by a V-shaped leaf spring retaining member 31 formed in top wall 29. The lower ends of legs 30 are formed with Z-shaped configurations 32 so as to be snap-fitted and retained within holes 34 formed in circuit board 20 to facilitate soldering of leg ends 32 to the printed circuit board. After soldering, the terminal ends of leg ends 32 are clipped off.

A potentiometer 37 is mounted on circuit board 20 and provides a user-adjustable sensitivity selector to vary the sensitivity of the pickup based upon the type of ignition system and components being tested. Potentiometer 37 can be set by an adjusting screw or stem 38, either at the factory before installing circuit board 20 within case 2, or by the user of the tool, by separating sections 3 and 4 of case 2 providing access to the circuit board mounted therein.

Referring again to FIGS. 5 and 6, LED bushing 11 is formed of a plastic material and has a cylindrical outer shape so as to be slidably fitted and bonded within circular open end 7 of case section 4. Bushing 11 has an orienting knob 39 formed thereon which is adapted to seat within a U-shaped notch 40 (FIG. 3) formed in an end wall 41 of indicating section 4 of case 2, to ensure the proper mounting of bushing 11 therein. Bushing 11 is formed with a central opening 43 in which an LED 45 is slidably mounted and which projects slightly therefrom as shown in FIG. 6. LED 45 is connected by wires 46 to circuit board 20 and is located within a hollow bore 47 of bushing 11.

As shown in FIG. 6, bushing 11 has a cutout portion which forms a shoulder 48, which is abutted by the end of circuit board 20 when installed therein. This relationship ensures that bushing 11 and circuit board 20 are installed correctly within hollow interior 21 of case 2.

In accordance with one of the features of the invention, the plastic material of bushing 11 is of such a composition that it will glow when subjected to the light of LED 45, thereby providing an increased lighted area at the pickup end of firing indicator 1 to increase the visibility thereof. One example of such a plastic material is sold under the trademark DELRIN distributed by Dupont.

In accordance with another of the features of the invention, a pickup antenna indicated generally at 50, is mounted in pickup section 3 of case 2. Antenna 50 is formed by a compression coil spring 51, spring cap 53 and a metallic clip 52. Clip 52 is mounted on the end of circuit board 20 and is in sliding electrical contact with a metallic cup-shaped cap 53 which traps one end of spring 51 therein. Spring 51 preferably has a large coil section 55 and a smaller coil section 56, with large coil section 55 abutting against an internal annular shoulder 57 formed in the pickup end of case section 3. The smaller diameter coil section 56 extends into dielectric end cap 10 which is bonded within open end 6 of pickup case section 3. Cap 10 extends towards an opposite side of annular shoulder 57 than coil spring section 55. To facilitate assembly, end cap 10 and bushing 11 may be molded integrally with the remainder of sections 3 and 4 of case 2.

In addition to functioning as part of the pickup antenna, coil spring 51 forces circuit board 20 into abutting relationship with bushing 11 for mounting board 20 within hollow interior 21 of case 2. Spring 51 furthermore functions as a shock absorber so that if tool 1 is dropped on its end whereupon LED 45 strikes the ground, it will reduce damage to the tool. Antenna clip 52 preferably is formed of copper and may be gold plated to prevent corrosion and to assure good electrical contact with metallic cap 53 and antenna spring 51 and with the control circuit mounted on circuit board 20.

FIG. 7 shows schematically one type of circuitry which may be formed on circuit board 20 and located within case 2 for carrying out the objectives of the invention. The primary requirement of diagnostic tool 1 is to non-invasively detect the voltages produced by an ignition system and provide a visual or audio indication of such voltages. This can help a mechanic working on a car engine, stationary engine, motorcycle or other engine or engines to diagnose ignition and spark plug problems.

Another important requirement of diagnostic tool 1 is to provide a mechanism to help reduce the potential for arcing between the case of the tool and an exposed spark plug wire or other ignition system component.

Also, it is desirable to supply a level of brightness of the firing indication so that it can be seen in bright sunlight, to operate using small hearing aid type batteries, and to have a battery test feature and reverse battery protection. The electronic circuit of FIG. 7, together with the structural elements and their cooperation with each other described above, provides these requirements.

The control circuit of FIG. 7 which is indicated generally at 59, includes a commercially available CMOS timer circuit 60, with an industry generic part number of "555 timer". Timer 60 can be configured to operate in a free running mode, called astable or a one-at-a-time pulsed mode called monostable. In the astable mode, the circuit generates pulses continuously of a high frequency and fixed duty cycle (ratio of time for one high pulse divided by time for one high and one low pulse). In the monostable mode, a single pulse is generated whenever a trigger signal is applied to the circuit that exceeds a certain voltage threshold.

The circuit shown in the schematic diagram of FIG. 7 is a monostable circuit. Resistor R1 and capacitor C1 define the width of a pulse that is produced. The values are set for a pulse width of approximately 14 milliseconds. Varying R1 and C1 will change the output pulse width which in turn varies the amount of time the LED is ON or illuminated for each spark plug firing.

The electric field sensor provided by the control circuitry of FIG. 7 is a simple antenna formed by spring 51 and cap 53, which is coupled to a high impedance input of timer circuit 60. The primary advantages of the antenna circuit over a neon-based circuit are greater sensitivity to the electric field and it requires no metal to be exposed to the ignition system components.

Control circuit 59 also provides a threshold comparator which does a comparison between the signal received from electric field antenna 50 and an internal reference to detect the ignition voltages. The internal reference is fixed but the signal from the antenna can be scaled to provide an overall sensitivity adjustment.

The duration of the electric field for each firing of a spark plug is on the order of tens of microseconds, while the amount of time between firings is 33,000 microseconds (for an 8-cylinder engine at 3500 RPM) or higher. Since a direct indication of these short-duration pulses can't be seen by the human eye, circuit 59 uses timer 60 to pulse the LED once for each firing, but leaves the LED on for typically 10–14 milliseconds, per firing, to allow the indication to be seen.

Control circuitry 59 also provides an indicator circuit which provides an indicator or brightness circuit which provides the necessary current drive to light up a high-candlepower, light-emitting-diode (LED), as an indication of the ignition system voltages.

A series-connected stack of three 1.5 V D.C. batteries 25 are connected to the emitter of PNP transistor 62. This transistor provides reversed-battery protection for the circuit (by having the circuit powered off) with the emitter reverse-biased with respect to the base when the batteries are installed incorrectly. Resistor R5 is used to limit the base current of the transistor when the batteries are installed correctly and the transistor is on.

Pin 63 of timer circuit 60 is a trigger input. Supplying sufficient voltage and current to this pin will enable the monostable pulse to be generated by timer 60. To detect the firing of ignition system voltage, antenna 50 is connected to pin 63 by line 64 which will pickup the electric field indicated by Arrows 65, generated by the voltages of the ignition system.

To control the level of sensitivity of the electric field pickup, resistor R3 is connected to ground 66 and to the trigger input. The value of R3 can be changed depending upon the size and shape of antenna 50.

Pin 68 of timer 60 is tied to the collector of an internal NPN transistor which has a monostable pulse driving its base and has its emitter tied to ground. Pin 68 is effectively connected to ground when the transistor is ON, due to a monostable pulse being generated. Resistor R4 and LED 45 are connected to pin 68 so that the LED will illuminate when the pulse is generated. Resistor R4 regulates the current through the LED when the LED is ON which in turn affects the brightness of the LED.

Pin 69 is a control voltage pin for timer 60 to allow the width of the output pulses to be controlled independently of the R1 and C1 values. Capacitor C2 is used to stabilize the control voltage of timer 60 on pin 69. Pin 70 of timer 60 is the positive voltage pin for the device while pin 71 is the ground pin.

Pin 72 is a reset signal for timer 60. Whenever pin 72 is connected to a voltage of less than approximately 1.0 V, the monostable circuit is reset generating an output pulse. Resistor R2 and capacitor C3 form a battery-test circuit when connected as shown in FIG. 7 to reset pin 72.

When switch 23 is closed by the inward movement of pocket clip 12, circuit 59 is powered up with capacitor C3 holding reset pin 72 to ground before it rises exponentially to V+. The time constant formed by R2 and C3 defines the amount of time the reset is held low and thus, the amount of time the LED is ON during the initial battery test portion of the powerup. If the batteries are dead or installed improperly, or if tool 1 is broken, the LED won't light during this initial powerup battery test.

Although circuit 59 described above and shown in FIG. 7, provides the advantages indicated and achieves the desired results, other circuits could be utilized without effecting the concept of the invention. If desired, LED 45 can be replaced with an audio alarm device 45A (FIG. 7) without effecting the concept of the invention by use of a piezoelectric horn, buzzer or the like. It also could be an oscilloscope or other signalling device.

Figure 8:
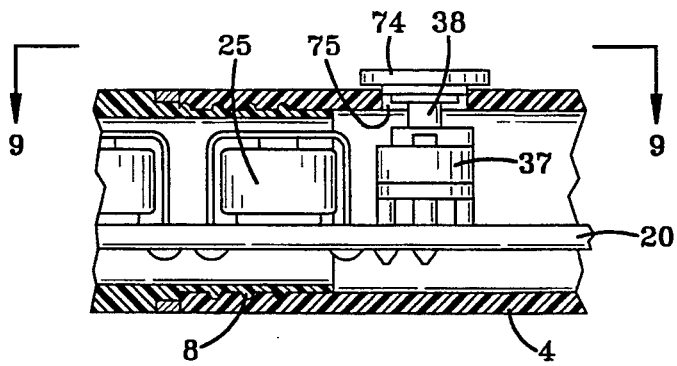
FIG. 8 is an enlarged fragmentary sectional view showing a modification to the diagnostic tool of FIGS. 1–6.
Figure 9:
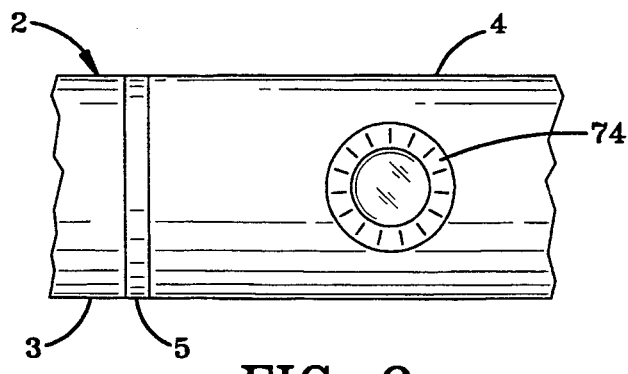
FIG. 9 is a fragmentary top plan view looking in the direction of Arrows 9—9, FIG. 8.

A modification to diagnostic tool 1 is shown in FIGS. 8 and 9. The user sensitivity adjustment potentiometer 37 is externally controlled by having a calibration knob 74 mounted on the end of adjustment screw or stem 38 which extends through a hole 75 formed in indicating section 4 of case 2. Thus, the user need not disassemble case 2 for adjusting potentiometer 37 as with the construction shown in FIG. 6, but merely rotates calibration knob 74 to a desired position, which in turn adjusts the internally located potentiometer 37 to adjust the sensitivity of the tool.

Accordingly, improved diagnostic tool 1 provides an extremely portable, hand held and hand operated tool, which uses an antenna for detecting the electric field generated by the spark plug firing portion of an ignition system of an engine, thereby eliminating the need for an external metal pickup. The diagnostic tool uses an LED or audio signal device for the firing indication, with the LED providing an increased brightness than the heretofore used neon tube or neon lamp. Furthermore, timer 60 as used in circuit 59, provides the capability to generate a relatively long indication signal in response to the very short duration of the firing of the ignition system. This allows the LED indication to be seen by the human eye, even though the electric field duration is too short to be seen directly. Circuit 59 also has the capability to vary the apparent brightness of the indicator LED by varying the length of time the LED is on as opposed to the time between firings. Up to a certain point, the longer the LED is on, the brighter it appears, even though the luminous intensity of the LED and the current through it remain constant.

Accordingly, the diagnostic tool is simplified, provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved diagnostic tool is constructed and used, the characteristics of the construction, and the advantageous, new and useful results obtained; the new and useful structures, devices, elements, arrangements, parts and combinations, are set forth in the appended claims.

We claim:

1. An ignition system diagnostic tool including:
   a portable hand held case having a pickup end adapted to be placed adjacent a component of a spark plug firing portion of an ignition system to be tested;
   antenna means mounted in the case adjacent the pickup end for receiving an electric field generated by an ignition system, said antenna means including a metallic member and a metallic spring located within the pickup end of the case;
   circuit means including a power source and an elongated printed circuit board located within the case electrically operatively connected to the antenna means for detection of the received electric field and for generation of a detected electric field signal; and
   indicator means in an opposite end of the case from the pickup end, operatively connected to the circuit means for providing a positive indication of the detected electric field.

2. The diagnostic tool defined in claim 1 in which the case is an elongated hollow tubular member formed of a dielectric material; and in which the antenna means is mounted within the tubular member adjacent the pickup end thereof, and the indicator means is an LED mounted in an indicator end of said tubular member.

3. The diagnostic tool defined in claim 2 in which the circuit means includes means for controlling the brightness of the LED.

4. The diagnostic tool defined in claim 2 in which the circuit means includes means for controlling the brightness of the LED by regulating the width of a pulse which actuates the LED.

5. The diagnostic tool defined in claim 1 in which the case is an elongated tubular member; in which the pickup end of the tubular member is closed; and in which the metallic spring is a compression coil spring mounted in compression within the closed end of the case and in contact with the metallic member of the antenna means.

6. The diagnostic tool defined in claim 5 in which the antenna means is electrically connected to the circuit means by a metallic clip mounted on an end of the printed circuit board engageable with the metallic member.

7. The diagnostic tool defined in claim 5 in which the indicator end of the tubular member is open; in which a bushing formed of a dielectric material is mounted within said indicator end opening and is formed with a central opening for slidably receiving and exposing the LED therein; and in which alignment means is formed on the bushing to ensure proper orientation of the bushing and LED and printed circuit board within the tubular member.

8. The diagnostic tool defined in claim 1 in which the circuit means includes a power source test circuit.

9. The diagnostic tool defined in claim 1 in which the circuit means includes a sensitivity selector to vary the sensitivity of the detection of the electric field by the circuit means.

10. The diagnostic tool defined in claim 1 in which the circuit means includes a spring biased ON/OFF switch biased to the OFF position.

11. The diagnostic tool defined in claim 10 in which the ON/OFF switch includes a spring biased flexible pocket clip mounted on the exterior of the case and a plunger mounted within the case and actuated by the pocket clip through an opening formed in said case adjacent the plunger switch to actuate said switch.

12. An ignition system diagnostic tool including:
a portable hand held case having a pickup end adapted to be placed adjacent a component of a spark plug firing portion of an ignition system to be tested;
metallic spring antenna means mounted within the case adjacent the pickup end for receiving an electric field generated by an ignition system;
circuit means located within the case electrically operatively connected to the antenna means for detection of the received electric field and for generation of a detected electric field signal, said circuit means including a power source and a printed circuit board and a sensitivity selector to vary the sensitivity of the detection of the electric field by the circuit means; and
indicator means in an opposite end of the case from the pickup end, operatively connected to the circuit means for providing a positive indication of the detected electric field.

13. The diagnostic tool defined in claim 12 in which the circuit means includes a replaceable power source.

14. The diagnostic tool defined in claim 13 in which the circuit means includes an elongated printed circuit board located within the tubular member; and in which the antenna means includes a metallic cap and a metallic spring located in the pickup end of the tubular member and in electrical communication with the circuit means.

15. The diagnostic tool defined in claim 14 in which the power source includes a plurality of batteries; and in which a plurality of metallic spring clips are soldered onto the printed circuit board to secure said batteries thereon.

16. The diagnostic tool defined in claim 15 in which the spring clips are generally U-shaped with a pair of spaced legs; in which the spaced legs extend through holes formed in the printed circuit board to temporarily mount said clips thereon; and in which each of the batteries is retained on the circuit board between the spaced legs of a respective one of the spring clips.

17. The diagnostic tool defined in claim 12 in which the sensitivity selector is a user adjustable potentiometer.

18. The diagnostic tool defined in claim 17 in which the potentiometer includes a stem which projects through an opening formed in the case; and in which an adjusting knob is connected to said stem for manually adjusting the sensitivity of the sensitivity selector.

19. The diagnostic tool defined in claim 12 in which the sensitivity selector is a fixed resistor.

20. An ignition system diagnostic tool including:
a portable hand held case having a pickup end adapted to be placed adjacent a component of a spark plug firing portion of an ignition system to be tested;
antenna means mounted within the case adjacent the pickup end for receiving an electric field generated by an ignition system;
circuit means located within the case electrically operatively connected to the antenna means for detection of the received electric field and for generation of a detected electric field signal;
indicator means in an opposite end of the case from the pickup end, operatively connected to the circuit means for providing a positive indication of the detected electric field upon receiving the generated electric field signal; and
said circuit means including a spring biased ON/OFF switch biased to the OFF position, said switch having a spring biased flexible clip mounted on the exterior of the case and a plunger mounted within the case and actuated by the clip through an opening formed in said case adjacent the plunger switch to actuate said switch to the ON position for electrically operatively connecting the antenna means to the indicator means through the circuit means.

21. The diagnostic tool defined in claim 20 including a dielectric sleeve slidably mounted on the case and movable between the plunger and clip to prevent accidental depressing of the plunger by the clip to maintain the switch in the OFF position when the sleeve is in a first position, and is movable over the clip to maintain the clip in engagement with the plunger securing the switch in the ON position when the sleeve is in a second position.

* * * * *